United States Patent [19]
Jacoby

[11] Patent Number: 5,535,515
[45] Date of Patent: Jul. 16, 1996

[54] METHOD OF MANUFACTURING A STRESS-FREE HEATSINK ASSEMBLY

[76] Inventor: John Jacoby, Jackson Pond Rd., New Hampton, N.H. 03256

[21] Appl. No.: 403,075

[22] Filed: Mar. 13, 1995

[51] Int. Cl.⁶ ..................................................... B23P 15/26
[52] U.S. Cl. .......................... 29/890.03; 29/505; 165/185
[58] Field of Search ................................... 29/890.03, 458, 29/464, 505, 509; 165/185, 905

[56] References Cited

U.S. PATENT DOCUMENTS

| | | | |
|---|---|---|---|
| 3,327,779 | 6/1967 | Jacoby | 165/185 |
| 4,022,272 | 5/1977 | Miller | 29/890.03 |
| 4,491,557 | 1/1985 | Breitmoser et al. | 29/890.03 |
| 4,709,374 | 11/1987 | Jacoby | 165/185 |
| 4,733,453 | 3/1988 | Jacoby | 29/432 |
| 5,014,776 | 5/1991 | Hess | 29/509 |
| 5,224,538 | 7/1993 | Jacoby | 165/166 |
| 5,247,734 | 9/1993 | Lubbe et al. | 29/890.03 |
| 5,406,698 | 4/1995 | Lipinski | 29/890.03 |
| 5,499,450 | 3/1996 | Jacoby | 165/185 |

*Primary Examiner*—Irene Cuda
*Attorney, Agent, or Firm*—Barlow & Barlow, Ltd.

[57] ABSTRACT

A stress-free heatsink assembly and method of manufacturing the same with wire elements embedded into a cured, flexible support element without a rigid base is provided. The heads of the wire elements are embedded in the support element with the enlarged contact surface being in close proximity to and coplanar with the lower surface of the support element. The heatsink assembly adapts to the contour and surface of the heat source as the heat source thermally expands and contracts. Each of the wire elements move independently of one another to adapt to the changing heat source surface to ensure excellent contact of the heat dissipating wire elements to the surface of the heat source at all times. In the manufacture of the stress-free heatsink assembly, the wire elements are introduced into a die member with the heads exposed, a curable media is then placed on top of the heads of the wire elements. A pressure plate provides force to curable media to extrude out excess media on the heads. The media is then cured and can be then removed from the surface of the die with wire elements embedded therein. The stress-free heatsink assembly permits the employment of wire elements of varying size, configuration, array, and material composition. The heatsink assembly may be easily cut to size in accordance with design specifications.

3 Claims, 3 Drawing Sheets

5,535,515

METHOD OF MANUFACTURING A STRESS-FREE HEATSINK ASSEMBLY

BACKGROUND OF THE INVENTION

The present invention relates generally to multiple-pin heatsink assemblies for dissipating heat from a source of heat. More specifically, the present invention relates to a multiple-pin heatsink assembly that is free of stress and is capable of being affixed to and dissipating heat from a heat source with a non-planar surface.

In the field of multiple-pin heatsinks and heat exchange devices, it has been well known to employ a rigid planar base plate for direct mounting to the heat source, such as a circuit board or semiconductor device chip. The base plate includes a number of pins attached directly thereto and extending up from the upper surface of the base plate for maximum exposure to the surrounding air. For effective heat dissipation, the base plate and the pins are composed of a heat dissipating metal. In the prior art, the upstanding pins are typically incorporated into the same mold as the base plate to generate a single integral structure. In the prior art, the upstanding pins have also been brazed or soldered directly to the base plate to form the heatsink device. As a result, there is a limitation of the selection of metal materials that can be used in the heatsink assemblies of the prior art. In particular, the pins and the base plate must be of the same material when the device is formed from a single mold. In addition, there are limitations in the choice of metals that can be used in a brazing or soldering method of assembly due to the incompatibilities between two metals that are to be soldered together.

For example, U-shaped pin pairs of wire elements may be employed to construct a heatsink device. However, these U-shaped wire elements must be affixed to a base plate surface by a laborious and costly metallurgical process such as brazing, welding or soldering. The wire elements are introduced into a die and then solder paste is applied to the wire elements for receiving a base plate thereon. The entire fixture must then be heated in an oven to cure it to leave the base element with the upstanding pins connected thereto. This is a time consuming, tedious and relatively expensive procedure. Solder paste or brazing compound must be purchased and properly applied; the pins must be held in place and heat must be properly applied. Similarly, welding techniques are likewise expensive, time consuming and complex and often provide less than optimum results.

As an alternative to employing U-shaped wire elements, the heatsink assembly may be cast. However, casting methods require expensive molds and heat sources. Further, the metal alloys employed in the casting of multiple-pin heatsinks are typically limited to materials which are relatively poor conductors of heat. Also, the casting process itself reduces the heat dissipation of the metal alloys because porosity and granular structure are typically formed in the cast pins. Moreover, due to the surface tension of the molten pin material, it is extremely difficult to draw that material into the extremely narrow pin molds even using a vacuum pump.

Each of these prior art heatsink assemblies suffer from the disadvantage of having a rigid planar base plate for supporting the heat dissipating pins. Such a rigid base plate construction is required not only for the manufacture of the assembly but also the installation and mounting of the assembly to a heat source. These prior art assemblies suffer from inferior performance because the rigid and planar plate employed cannot easily adapt to a non-planar heat source surface, nor can it adapt or flex in response to stress created on the surface of a heat source. As a result, prior art heatsink assemblies buckle and separate from their heat source surface resulting in an air gap between the heatsink assembly and the heat source causing poor heat dissipation.

For example, the computer industry, as well as the electronics field, is having increasing difficulty in dissipating heat from higher performance chips. There is a growing need for higher heatsink dissipation with no increase in chip operating temperatures, which have reached maximum levels for reliability. The semiconductor chip material is not compatible with the effective heatsink metals as to thermal expansion rates. In order to minimize interface temperature gradients, the chip and heatsink are bonded as closely as possible, which creates destructive thermal stress in the chip when mated to a heatsink assembly with a rigid and planar base plate. Due to the demand for a stress-free heatsink assembly, it is desirable for a heatsink assembly to include a pin grid array with a flexible base support that can freely adapt to heat source surfaces caused by thermal expansion. It is also desirable to include a flexible base or support structure that can permit optimum heat transfer from the heat source to the heat dissipating pins. It is desirable that no soldering or brazing be required to assemble the heatsink.

SUMMARY OF THE INVENTION

The present invention preserves the advantages of prior art heatsink assemblies and methods. In addition, it provides new advantages not found in currently available heatsink assemblies and methods, and overcomes many disadvantages of such currently available assemblies and methods of manufacture.

The invention is generally directed to a novel and unique stress-free heat assembly and method of manufacturing the same. The test fixture of the present invention enables the simple, easy and inexpensive assembly, use and installation of a heatsink assembly that is flexible to adapt and adjust to a heat source surface which has become non-planar due to thermal expansion. In addition, the present invention may accommodate heat source surfaces which are naturally non-planar, such as a cylindrical incandescent light bulbs.

The present invention allows the manufacture of high performance heatsinks that will not generate stress forces. The preferred embodiment is manufactured by embedding individual heat dissipating pins in a semi-thermoplastic media that allows a heat source surface, e.g. semiconductor ship, to expand and contract without losing contact with the individual heat dissipating pins. The method of manufacture is also effective for attaching heat exchange ability on irregular or dissimilar surfaces, such as ceramics, high intensity lighting, or other heat exchanger configurations.

The preferred embodiment of the present invention includes a flexible support element having an upper surface and a lower surface. A number of metal, heat-conductive elements, with one end being substantially flat, are embedded in the support element so that the upper portions of the heads are laterally surrounded by the flexible support element. It is preferred a thin negligible film layer remain on the flat surfaces of the heads. The support element, with metal elements embedded therein, is affixed to a heat source with a thin film layer disposed therebetween. If a thin film layer remains, it is thin enough that heat transfer from the heat source to the metal elements is substantially unimpeded. In addition, heat conductive adhesive filler is later applied to the heads to provide good heat transfer and to fill any irregularities.

In the method of manufacturing the multiple-pin heatsink device of the present invention, a die member is provided with a number of wire element receiving holes in its upper surface. A number of metal wire elements, each with a head, are introduced into respective receiving holes with the heads remaining above the upper surface of the die member. A sheet layer of thermosettable flexible material, preferably from a roll, is placed on the heads of the metal elements. A pressure block is placed in contact with the die over the layer of the thermosettable material. Pressure is applied to the pressure block to extrude excess thermosettable material from between the pressure block and the heads to leave a thin layer of material on the heads. A thicker layer of material remains between each of the respective wire elements in the array. The thermosettable material is then cured to secure the wire element array in place. The wire elements are removed from the die member with the flexible support attached thereto. A conductive adhesive is then applied to the heatsink assembly for affixation to a heat source, such as a semiconductor chip.

It is therefore an object of the present invention to provide a heatsink assembly that is free from thermal stress.

Another object of the present invention is to provide a heatsink assembly that adapts and adjusts to a heat source surface that has changed due to thermal expansion.

It is a further object of the present invention to provide a heatsink assembly that can adapt and adjust to a non-planar heat source surface.

It is yet a further object of the present invention to provide a stress-free heatsink assembly that can be easily cut to size in accordance with design specifications.

It is another object of the present invention to provide a method of manufacture that has few steps and results in a durable and flexible heatsink assembly with superior heat dissipating characteristics.

Another object of the present invention is to provide a heatsink assembly that employs heat dissipating elements manufactured of different metal material.

BRIEF DESCRIPTION OF THE DRAWINGS

The novel features which are characteristic of the present invention are set forth in the appended claims. However, the inventions preferred embodiments, together with further objects and attendant advantages, will be best understood by reference to the following detailed description taken in connection with the accompanying drawings in which:

DETAILED DESCRIPTION OF THE PREFERRED EMBODIMENT

Figure 1:
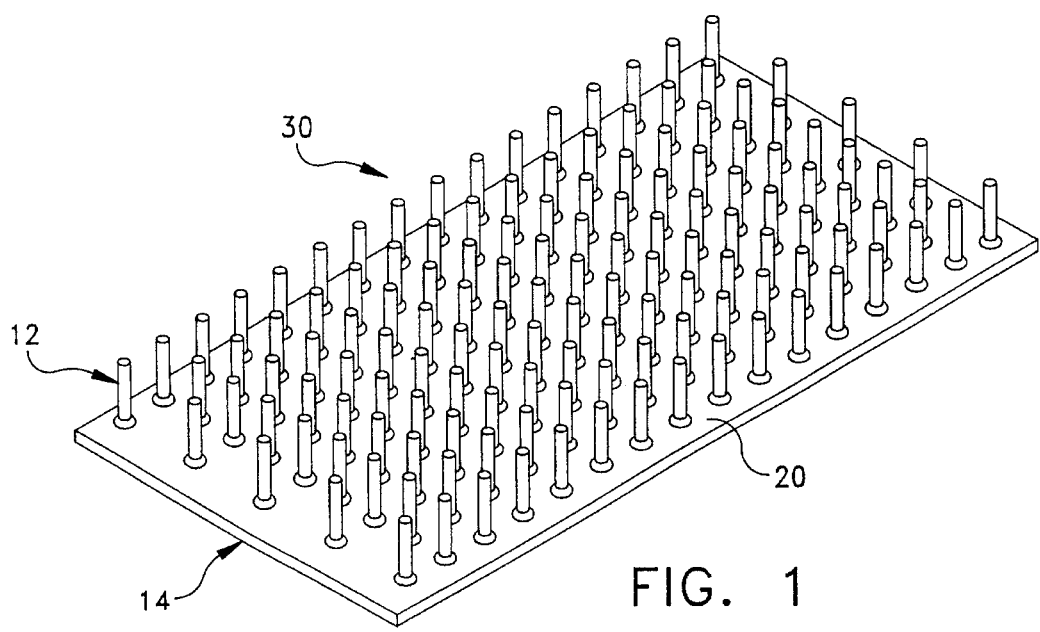
FIG. 1 is a perspective view of the preferred embodiment of a completed stress-free heatsink assembly of the present invention.

Referring to FIG. 1, a perspective view of a stress-free heatsink assembly 30 of the present invention is shown. The completed stress-free heatsink assembly includes a support element 14 with conductive wire elements 12 embedded therein. As can be seen in FIG. 1, and in greater detail in FIG. 2, support element 14 provides a support framework for conductive wire elements 12 which are embedded therein. The wire elements 12 are rooted in support element 14 with ends 12a of wire elements 12 being above top surface 20. As a result, a large surface area of conductive wire elements 12 remain exposed above upper surface 20 for dissipation of heat. This includes a portion of head 12 which is exposed to the air to further improve heat dissipation.

Figure 2:
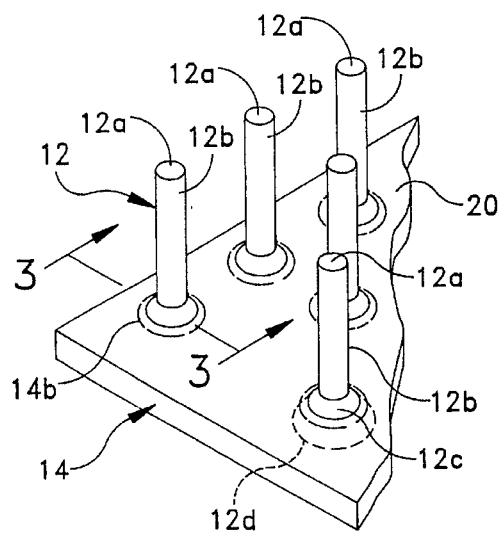
FIG. 2 is a perspective view of a close-up of a portion of the heatsink assembly of FIG. 1 showing rivet-shaped wire elements embedded within the support member.
Figure 3:
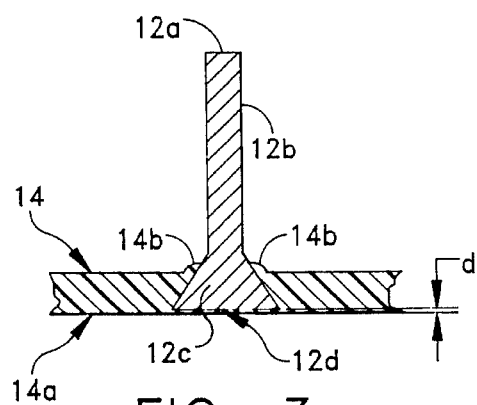
FIG. 3 is a cross-sectional view through the line 3—3 of FIG. 2.

Turning now to FIG. 3, which shows a cross-sectional view through the line 3—3 of FIG. 2, the embedding of one of the conductive wire elements 12 is shown in detail. In particular, each conductive wire element 12 includes an end portion 12a, a shank portion 12b and a head 12c which has an enlarged contact surface 12d as compared to the cross-sectional area of the shank portion 12b. Portions 12a and 12b provide a pin-like structure. As can be seen in FIG. 3, head 12c is embedded within support element 14. As a result, contact surface 12d is positioned in close proximity to and coplanar with the lower surface 14a of support element 14 with an upper portion thereof preferably remaining above the top surface of support element 14. Thickness d is extremely small and is preferably zero but may be extremely small, such as less than one millimeter in thickness. As will be discussed below, ridges 14b are formed and help lock the wire element 12 to the support element 14.

Referring back to FIG. 1, it can be seen that the entire array of embedded conductive wire elements 12 results in a heatsink assembly which may be affixed to a heat source surface for the dissipation of heat. Lower surface 14a of support element 14, as shown in FIG. 3, is affixed directly to the surface of a heat source, such as a semiconductor ship. Support element 14 is preferably flexible media which permits the conductive wire elements 12 to move and adjust independently of one another. Peel-off release paper or high conductivity glue may be affixed to lower surface 14a of support element 14 to provide a means for adhering the entire heatsink assembly to the surface of a heat source.

Figure 4:
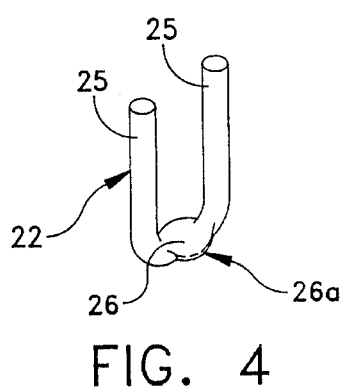
FIG. 4 is a perspective view of a U-shaped wire element which may be employed as an alternative to the rivet-shaped wire elements in the preferred embodiment.
Figure 5:
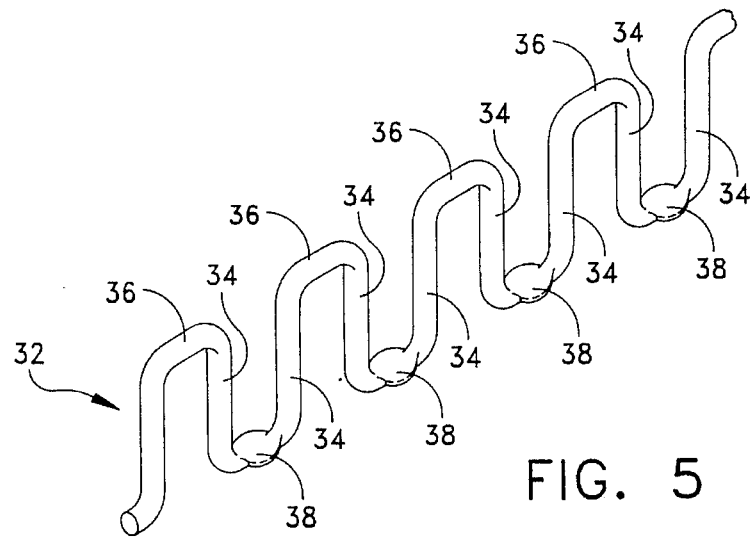
FIG. 5 is a perspective view of a serpentine wire element of connected U-shaped wire elements as an alternative to the rivet-shaped wire elements of the preferred embodiment.

FIGS. 4 and 5 illustrate alternatives to the preferred rivet-shaped wire elements shown in FIGS. 1–3. FIG. 4 illustrates a U-shaped staple wire element 22 with upstanding pins 25 and a flattened central portion 26 having a wide lower surface contact area 26a. Similarly, FIG. 5 shows another alternative conductive wire element 32 which includes a serpentine array 32 of several U-shaped wire elements connected to one another with upstanding pins 34, connecting portions 36 and flattened central portions 38. As will be described in detail below, the alternative conductive wire elements shown in FIGS. 4 and 5 may replace the preferred rivet-shaped wire elements of the preferred embodiment in accordance with design specifications. Therefore, for example, it may be preferable to employ U-shaped wire elements instead of rivet-shaped elements depending on the particular design specifications.

The stress-free heatsink assembly of FIG. 1 relieves mechanical stress and the problems associated therewith, namely thermal expansion problems. For example, in the prior art, heatsinks are typically made of a rigid and planar section of conductive material. This rigid section of material must have an exact, close tolerance mechanical fit to provide close mating for efficient heat transfer. The present invention is insensitive to thermal stress which occurs due to the temperature differential and transfer of heat from the heat source to the heatsink itself.

Support element 14 is preferably a mastic material media, such as epoxy or thermoplastic. The embedding of conductive wire elements 12 in the support element 14, which is flexible, enables the wire elements to move about and flex relative to lower surface 14a of the support element 14. In addition, the flexible characteristics of the support element 14 enables horizontal flexibility to permit additional stress relief. In particular, since the enlarged area contact surface 12d of the conductive wire elements 12 are positioned in close proximity to and coplanar with the lower surface 14a, efficient heat transfer from the surface of the heat source to the wire elements 12 can be achieved without employment of a rigid planar base member as in the prior art. During the changes in contour of the heat source surface, the flat contact surfaces 12d are permitted to remain in contact with the heat source surface because they are permitted to move independently of one another since they are not bound in a rigid heatsink, but instead a flexible, contour-adaptable support element 14. Such flexibility provides a superior heatsink because even the slightest buckling of the heat source due to thermal expansion can create an air gap in prior art devices which diminishes heat dissipating ability. The present invention immediately adapts to such changes. In addition, the present invention may be affixed to a naturally non-planar surface, such as incandescent light bulbs. Therefore, the stress-free heatsink assembly of the present invention is extremely versatile and not subject to degradation in heat dissipation quality.

In addition, the present invention provides considerable design flexibility. For example, the array of wire elements can be arranged in many different ways, such as an open array for maximum air flow or, in the alternative, a closely spaced and interlocked array for maximum contact surface coverage. Further, conductive wire element material and their relative sizes and configurations may be varied or even mixed in accordance with design specifications. For example, unlike the prior art, pins of dissimilar metals may be incorporated into the same heatsink assembly. Alternative wire elements, as shown in FIGS. 4 and 5, could also be employed or mixed with the rivet-shaped elements of FIGS. 1–3. Such design flexibility is not possible in the prior art. Since prior art assemblies employ a rigid and planar base member, metallurgical brazing, welding or soldering must be employed to affix the wire elements to the base. However, it is not always possible to bond dissimilar metals to one another. Also, prior art methods of molding or casting the entire heatsink assembly structure would require a rigid base member to maintain the array of wire elements together.

Overall, the present invention provides versatility and flexibility not found in a prior art.

Turning now to FIGS. 6–9, the steps of manufacture, in accordance with the method of the present invention, is shown. A die member 10 is shown to include an array of wire element or pin receiving apertures 24 in its upper surface 28. Rivet-shaped wire elements 12 are inserted into wire element receiving apertures 24 to form an array as desired. The arrangement, configuration and spacing of the receiving apertures may be adapted to the desired final configuration of wire elements 12, as shown in FIG. 1. For example, pairs of wire element receiving apertures 24 would be provided should U-shaped elements, as in FIG. 4, be employed.

Figure 6:
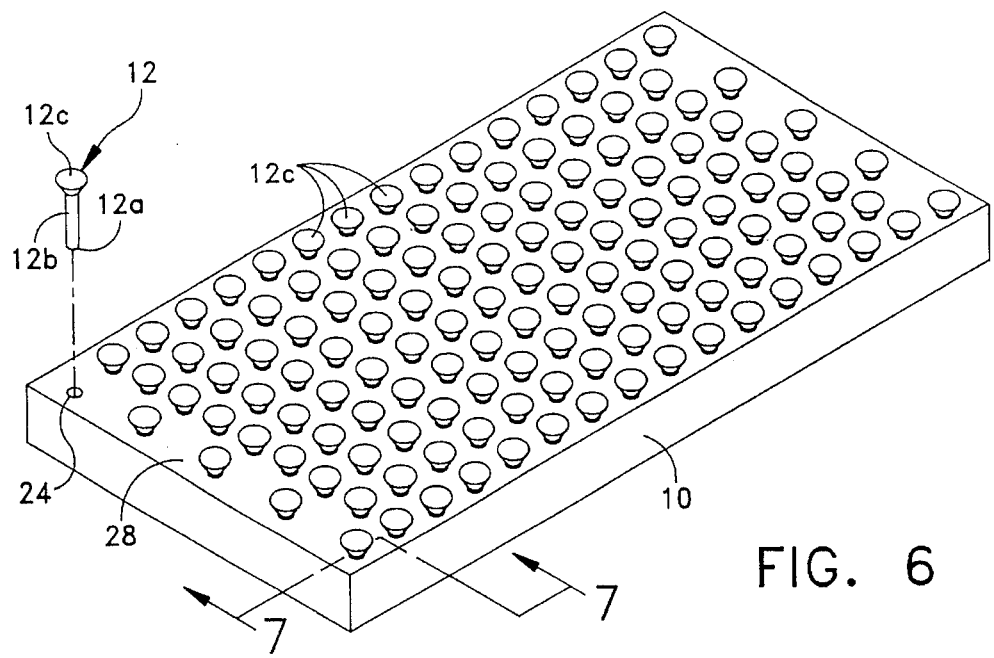
FIG. 6 is a perspective view of a die fixture and rivet-shaped wire elements residing therein which is employed in the method of manufacture of the stress-free heatsink assembly of the present invention.
Figure 7:
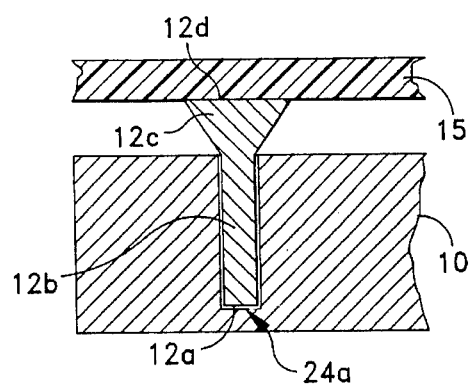
FIG. 7 is a cross-sectional view through the line 7—7 of FIG. 6 after the support member media has been applied.

In the manufacture of the stress-free heatsink assembly 30 of the present invention, wire elements 12 are installed into receiving apertures 24 with end 12a being inserted first therein. After conductive wire elements 12 are inserted into their respective apertures 24, the heads 12c will remain above top surface 28 of die member 10. FIG. 7, a cross-sectional view through line 7—7 of FIG. 6, shows in detail the installation of a wire element 12 within its respective receiving aperture 24. As can be seen in FIG. 7, end 12a bottoms out to the floor 24a of receiving aperture 24. Shank 12b rests within receiving aperture 24 while flat heat 12c remains above and, essentially, resting on surface 28.

Conductive wire elements 12 may be, for example, copper, aluminum or any other heatsink pin materials. The conductive wire elements may be purchased with head 12c already formed from a third party manufacturer or, they may be created from lengths of wire where the flattened heads 12c are custom formed. In general, the conductive wire elements 12 each include a heat dissipating portion as well as a flat portion with an enlarged surface area for being placed in close proximity to the surface of a heat source.

Figure 8:
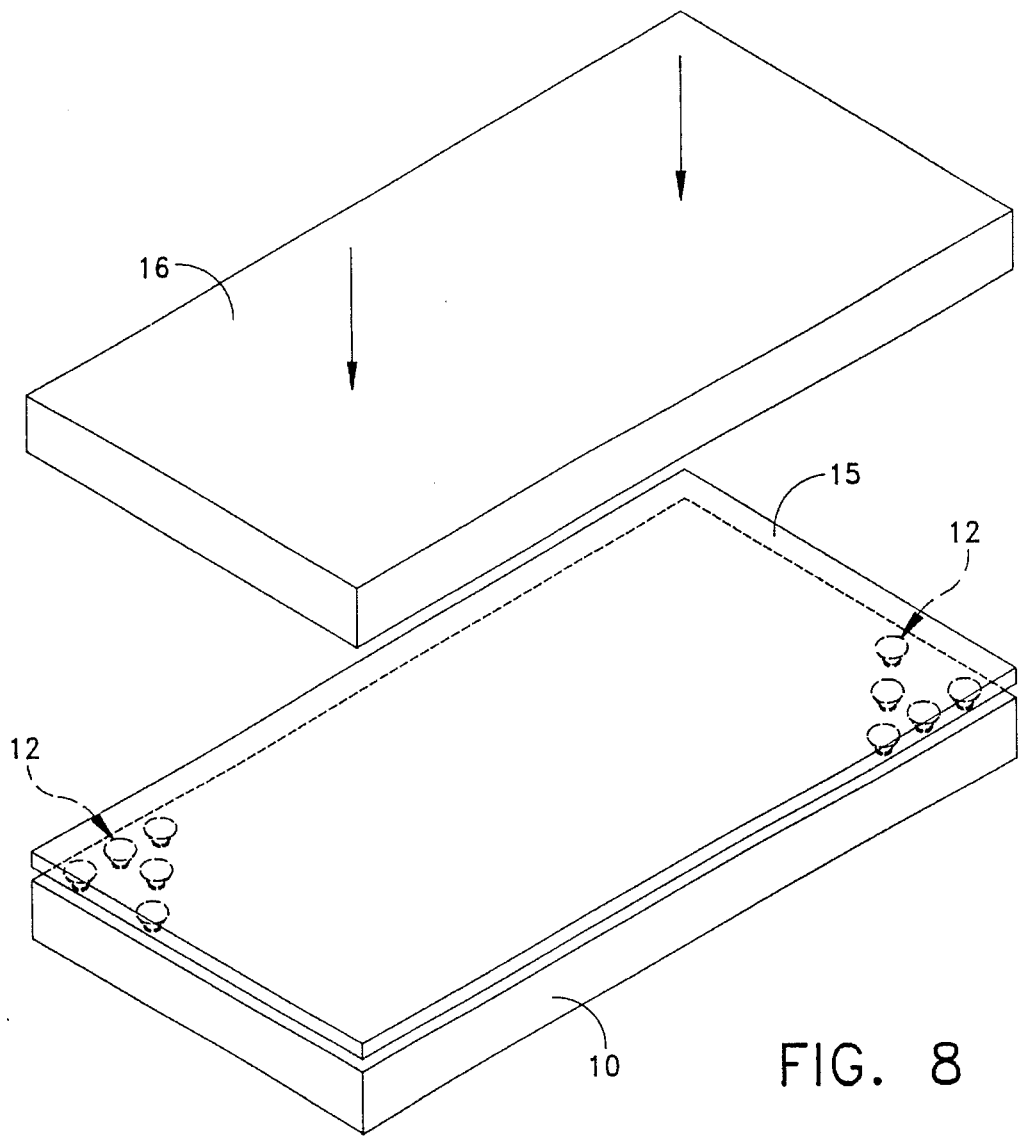
FIG. 8 is a perspective view of a step of driving the pressure plate to the die fixture in accordance with the method of manufacture of the heatsink assembly of the present invention.
Figure 9:
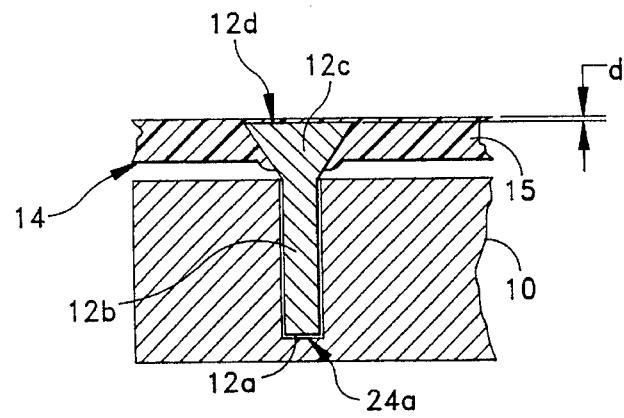
FIG. 9 is a cross-sectional view through the line 7—7 of FIG. 6 after support member material has been applied and subjected to force from the pressure plate.

Once the wire elements are installed into their respective apertures 24, the support element media 15, which is preferably a thermoplastic sheet material from a roll for ease of use, is applied to the upper surface 28 of die 10, as seen in FIGS. 7 and 8. Alternatively, support element media 15 may be of a paste-like consistency for spreading onto heads 12c. As a result, the support element media 15 sits on top of heads 12c in contact with surfaces 12d. In FIG. 8, a pressure plate 16 is placed into communication with media 15. Sufficient force is applied to pressure plate 16 to extrude out preferably all excess media 15 from the top of contact surfaces 12d of heads 12c of each conductive wire element 12. It is possible that a thin layer of material will remain on the surfaces 12d; however, it will likely be less than one millimeter in thickness which will not impair heat transfer. FIG. 9 illustrates the state of manufacture after excess media 15 is extruded by application of force through pressure plate 16. As can be seen, the thermoplastic media now forms support element 14 with the upper portion of heads 12c embedded therein leaving contact surface 12d preferably free from material 15. When wire elements 12 are later removed from die 10, ridges 14b, as seen in FIG. 3, will form to help lock wire elements 12 to support elements 14. Ridges 14b are formed when the heads 12c are driven into support element 14 and displaced material settles. Alternatively, leaving a thin layer of media assists in maintaining the integrity of the entire support element 14 and further prevents the conductive wire elements 12 from loosening while not sacrificing any heat transfer capabilities since the thickness d is negligible as far as reducing thermal transfer from contact surface 12d to the surface of a heat source.

The entire support element, with conductive wire elements embedded therein, is cured by heat or by chemical process in accordance with what is required by the media employed. Once the media is cured, release paper or a self-adhesive agent may be optionally applied to lower surface 14a of support element 14 and head surfaces 12d. In the alternative, lower surface 14a may be left bare to permit the customer to apply his or her own adhesive in accordance with the design specifications and the heat source onto which the heatsink assembly is to be applied.

The cured media, with conductive wire elements securely embedded therein, is removed from die 10 to expose shank portions 12b, ends 12a as well as portion of head 12c. Subsequently, the assembly may be cut up according to the desired size and shape as required by the application and heat source characteristics.

It would be appreciated by those skilled in the art that various changes and modifications can be made to the illustrated embodiments without departing from the spirit of the present invention. All such modifications and changes are intended to be covered by the appended claims.

What is claimed is:

1. A method of manufacturing a multiple pin heatsink device, comprising the steps of:

providing a die member with a plurality pin receiving holes in its upper surface;

providing a plurality of metal, heat-conductive, elements having at least one pin member and a head having a flat heat-receiving contact surface;

introducing said metal elements into respective pin receiving holes with said heads remaining above the upper surface of the die member;

applying a layer of thermosettable flexible material on said heads;

providing a pressure block;

placing said pressure block in contact with said layer of thermosettable material;

applying sufficient pressure to said pressure block to extrude excess thermosettable material from between said pressure block and said heads;

embedding a portion of said heads in said thermosettable material;

leaving a layer of thermosettable material between wire element portions above said upper surface;

removing substantially all thermosettable material on each flat heat-receiving contact surface of said heads;

curing said thermosettable material to provide a flexible support for carrying said metal elements; and removing said wire elements from said die member with said flexible support attached thereto.

2. The method of claim 1, further comprising the step of:

applying release paper to said flexible support for affixation to a heat source.

3. The method of claim 1, further comprising the step of:

applying a self-adhesive agent to said flexible support for affixation to a heat source.

* * * * *